US006593158B1

(12) United States Patent
Takahashi (10) Patent No.: US 6,593,158 B1
(45) Date of Patent: *Jul. 15, 2003

(54) SEMICONDUCTOR MEMORY AND MANUFACTURING METHOD OF THE SAME

(75) Inventor: Satoshi Takahashi, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/537,432

(22) Filed: Mar. 27, 2000

(30) Foreign Application Priority Data

Jul. 30, 1999 (JP) .......................................... 11-217932

(51) Int. Cl.$^7$ .................... H01L 21/266; H01L 21/8247
(52) U.S. Cl. .......................... 438/18; 438/289; 438/257
(58) Field of Search ................................ 438/257–267, 438/29, 17–18, 289–291

(56) References Cited

U.S. PATENT DOCUMENTS 5,196,361 A * 3/1993 Ong et al.
5,956,588 A * 9/1999 Choi et al. .................. 438/286
6,194,269 B1 * 2/2001 Sung et al. .................. 438/258
6,268,247 B1 * 7/2001 Cremonesi et al. ......... 438/258

FOREIGN PATENT DOCUMENTS

JP 6-282992 10/1994

* cited by examiner

Primary Examiner—Richard Booth
(74) Attorney, Agent, or Firm—Armstrong, Westerman & Hattori, LLP (57) ABSTRACT

A semiconductor memory comprises a first cell (memory cell) including a charge storage layer, and a second cell including a charge storage layer and used with its set threshold value fixed. The threshold value of the second cell is generally apt to return to the initial state, i.e., initial threshold value, when damaged by baking. So, the initial threshold value is shifted to approach the threshold value to be set, as closely as possible. The data retention characteristic of the second cell (reference cell, redundancy memory cell, or OTP region cell) formed into the same construction in the same process as the first cell, can be considerably improved without unnecessarily increasing steps of manufacturing process.

3 Claims, 10 Drawing Sheets

SEMICONDUCTOR MEMORY AND MANUFACTURING METHOD OF THE SAME

BACKGROUND OF THE INVENTION

1. Field of the Invention

The present invention relates to a semiconductor memory comprising memory cells each having a charge storage layer, and a manufacturing method of the device, particularly to a semiconductor memory further comprising reference cells used as criteria for judging various states of the memory cells, or other memory cells used to read only, and a manufacturing method of the device.

2. Description of the Related Art

Various portable electronics and home electric products are becoming multifunction, thus increased the importance of technique for integrating a nonvolatile semiconductor memory including charge storage layers (floating gates), such as EPROM or EEPROM, in which stored data is kept even after cutting the power supply, into a semiconductor memory represented by one-chip microcomputer. Such a semiconductor memory can be provided with semiconductor elements used with their stored data being hardly renewed (or erased), differently from the main memory cells of the device.

For example, a semiconductor memory is provided with, as necessary semiconductor elements, various reference cells used as criteria for judging various states of the main memory cells, e.g., used for read, for write verification, for erasion verification, and for over-erasion detection. The reference cell for read is used as a criterion in a normal read operation. The reference cell for write verification is used as a criterion after a write operation. The reference cell for erasion verification is used as a criterion after an erasing operation. The reference cell for over-erasion detection is used as a criterion for judging whether over-erasion has occurred due to an erasing operation for an adjacent memory cell. The device can be optionally provided with, e.g., redundancy memory cells for storing data to be displaced from a defective bit to a non-defective bit, or OTP region cells formed in a specific region (OTP region) to be programmable only once and inhibited from being erased after then.

Such semiconductor elements are usually formed into the same structure in the same process as the main memory cells, in view of, e.g., shortening of the manufacturing process, control of temperature characteristics and unevenness in process, and, in case of reference cells, an advantage that their threshold values being set can be minutely adjusted in testing process.

In manufacturing a semiconductor memory including such various semiconductor elements as described above, the semiconductor elements are formed simultaneously with the main memory cells and then their threshold values are set to the respective requested values by write and erasing operations, because they are mainly used to read only. More specifically, in the manufacturing process, the semiconductor elements and the main memory cells are simultaneously subjected to threshold value control (control to regulate into an initial threshold value) in their channel regions, and then the threshold values of the semiconductor elements are adjusted to the respective requested values.

Recently, integration in such a semiconductor memory is getting higher and higher, and it requires more miniaturization of memory cells, reference cells, etc., and more increase in interconnecting layers. It is generally known that the distance and the quantity of the interconnecting layer between a floating gate and a contact hole affect the so-called data retention characteristic in that occurrence of unexpected injection of electrons into the floating gate (charge gain) or unexpected extraction of electrons from the floating gate (charge loss) causes transformation of stored data. It is conjectured that etching plasma damage in forming the contact hole is a prime cause of deteriorating the data retention characteristic. The higher the integration and miniaturization are, the more the damage is apt to occur inevitably. So, the higher the integration and miniaturization in a semiconductor memory are, the more the data retention characteristic deteriorates.

Deterioration of the data retention characteristic is accelerated not only by integration and miniaturization in a semiconductor memory but also by heat and stress due to electric field. Such semiconductor elements as described above, which are mainly used to read only with their stored data being hardly renewed (or erased), e.g., various reference cells, redundancy memory cells, or OTP region cells, are subjected to very frequent read operations because of their modes of use, in comparison with the main memory cells of the device. For this reason, they receive electric field stress due to read operations for a longer time than the main memory cells. Such electric field stress may cause charge gain or loss. This is the same in case of reference cells having their threshold values widely different in accordance with their functions.

SUMMARY OF THE INVENTION

It is an object of the present invention to provide a semiconductor memory and a manufacturing method of the device, wherein the data retention characteristic of second cells (e.g., various reference cells, redundancy memory cells, or OTP region cells) formed into the same construction in the same process as first cells (memory cells) is considerably improved without unnecessarily increasing steps of manufacturing process.

According to an aspect of the present invention, a semiconductor memory comprises a first cell which is a memory cell including a charge storage layer, and a second cell including a charge storage layer and used with its set threshold value fixed to a certain value, wherein the second cell has its initial threshold value in manufacturing, different from the initial threshold value of the first cell, and controlled to approach the set threshold value as closely as possible.

The second cell may be one of various reference cells used as criteria for judging the threshold values set in accordance with various states of the first cell.

The second cell may be a memory cell used to read only.

For realizing such a feature of the second cell, the impurity concentration in the channel region of the second cell is preferably different from that of the first cell.

According to another aspect of the present invention, provided is a manufacturing method of a semiconductor memory comprising a first cell which is a memory cell including a charge storage layer, and a second cell including a charge storage layer and used with its set threshold value fixed to a certain value. The method comprises a step of introducing impurities into the channel region of the first cell to set its initial threshold value, and a step of introducing impurities into the channel region of the second cell to set its initial threshold value such that the initial threshold value approach the set threshold value as closely as possible. The step for the second cell is performed separately from the step for the first cell.

In the method, the first and second cells are preferably formed in the same process except the above steps.

Generally in a semiconductor memory comprising memory cells (first cells) as its main storage elements, and cell (second cells) each of which is formed into a nonvolatile memory structure including a charge storage layer like the memory cells, and used with its set threshold value fixed to a certain value, each second cell has the following nature. That is, the closer its set threshold value before being damaged is to its initial threshold value, the better its data retention characteristic is kept even when it is affected by high integration and miniaturization, and damaged by stress due to heat or electric field which is a prime cause of accelerating deterioration of its data retention characteristic. The present invention utilizes this nature. That is, the threshold values requested to be set for the respective second cells are used as standards, and the initial threshold values of the second cells are respectively controlled to approach the threshold values to be set, as closely as possible. More specifically, the impurity concentrations of the second cells are respectively controlled independently of the first cells when impurities for threshold value control are introduced into their channel regions in manufacturing. By thus decreasing the difference between the initial threshold value and the set threshold value, variation of the set threshold value before and after being damaged, becomes little, so the data retention characteristic is kept good.

The present invention, therefore, makes it possible to improve considerably the data retention characteristic of each second cell (such as a reference cell, a redundancy memory cell, or an OTP region cell) formed into substantially the same construction in substantially the same process as the first cells, without unnecessarily increasing steps of manufacturing process.

DETAILED DESCRIPTION OF THE PREFERRED EMBODIMENTS

Hereinafter, preferred embodiments of the present invention will be described with reference to the accompanying drawings.

Each embodiment described below exemplifies a semiconductor memory comprising nonvolatile memory cells (first cells) each of which includes a floating gate, and cells (second cells) each of which includes a floating gate likewise and is used with its threshold value being fixed into a predetermined set value.

In describing the embodiments, the principle of operation which the present invention is based on, will be described first.

Figure 1:
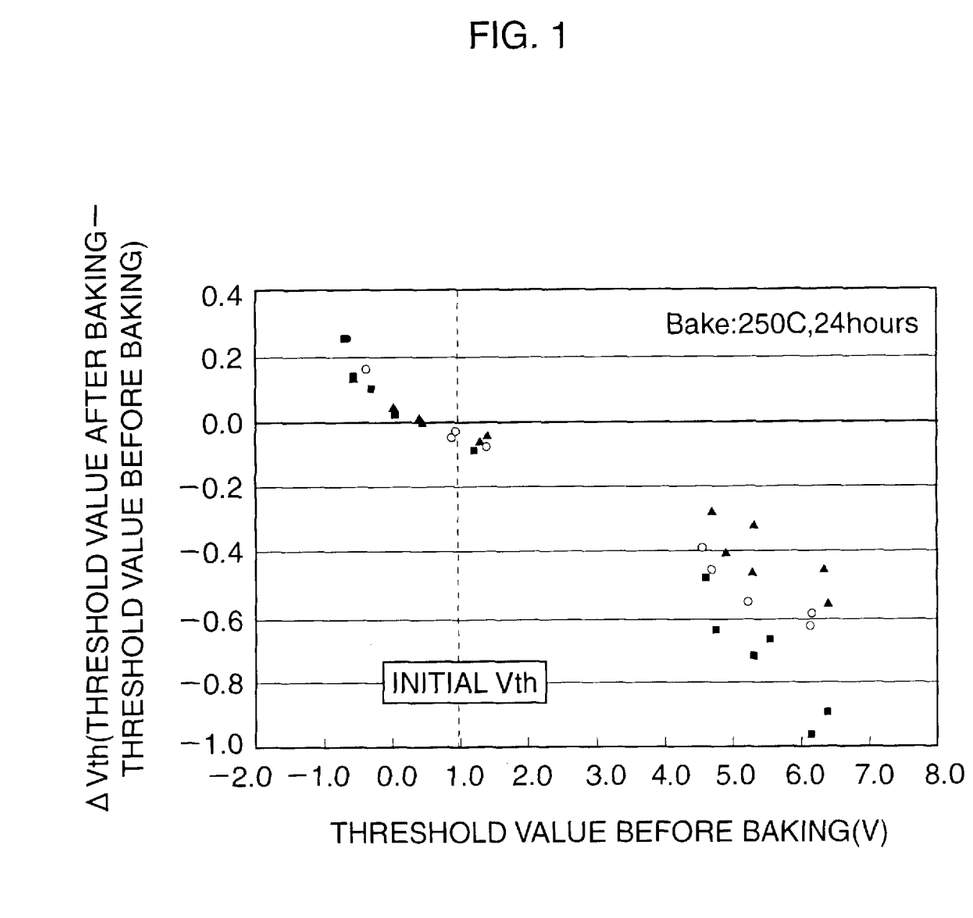
FIG. 1 is a graph showing a result of examining dependence on set threshold value of the data retention characteristic of second cells according to the present invention.

FIG. 1 is a graph showing a result of examining dependence on set threshold value of the data retention characteristic of second cells. In the examination, the second cells were regulated to have predetermined set threshold values, and then baked at 250° C. for 24 hours to apply thermal damage. Change αVth in threshold value (=(threshold value after baking)−(threshold value before baking)) was measured.

As known from FIG. 1, the greater the threshold value before baking is in comparison with the initial threshold value of about 0.9 V of each cell, the more the change αVth shifts in the negative direction. In this case, charge loss is apt to occur. Contrastingly, the smaller the threshold value before baking is in comparison with the initial threshold value, the more the change αVth shifts in the positive direction. In this case, charge gain is apt to occur. These suggest that the second cells have a nature that their threshold values are apt to return to the initial state, i.e., initial threshold value, when they receive baking damage.

The present invention utilizes the above nature. More specifically, the initial threshold value of each second cell is shifted to approach the set threshold value requested for the second cell, as closely as possible. The absolute value of the change αVth decreases to 0 V accordingly, and the data retention characteristic is kept good.

Embodiments of the present invention based on the above principle will be described hereinafter.

FIRST EMBODIMENT

The first embodiment of the present invention will be described. The first embodiment exemplifies a semiconductor memory comprising, as second cells, various reference cells for memory cells.

Figure 2:
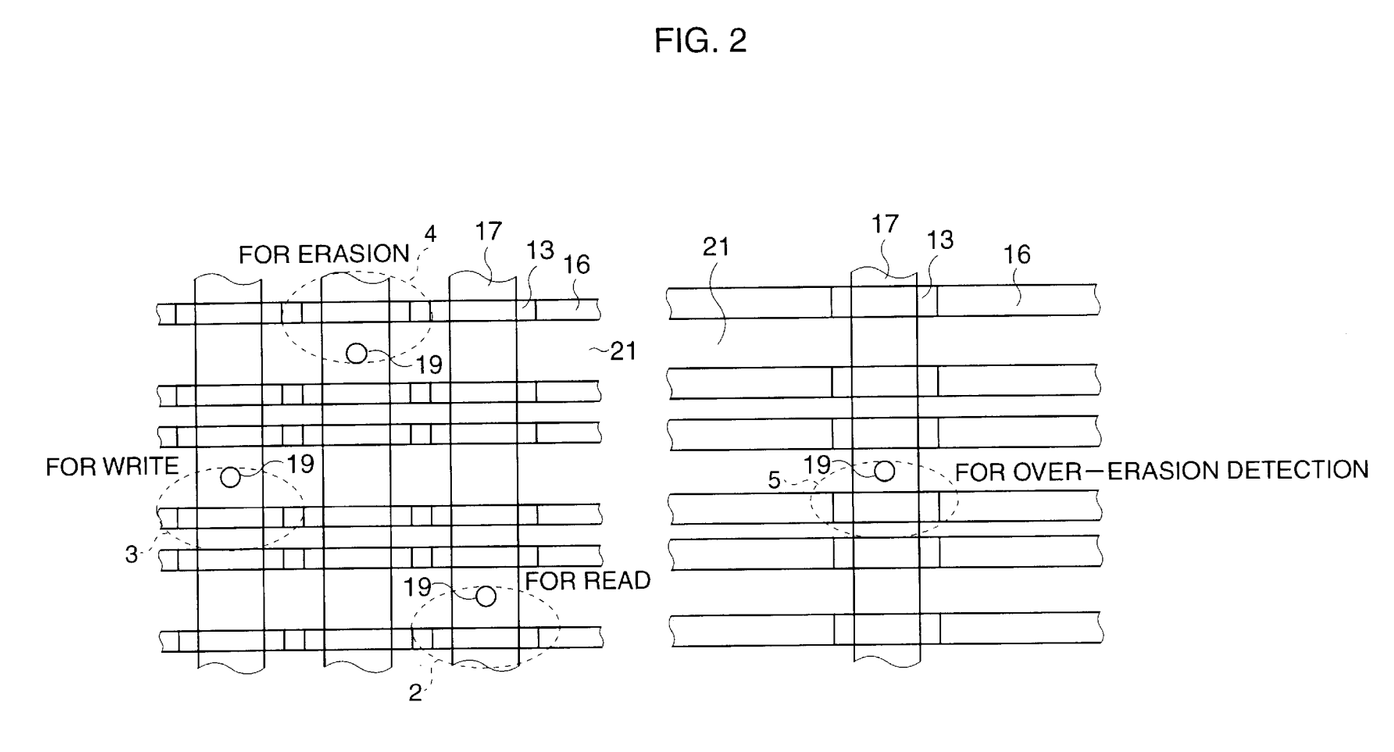
FIG. 2 is a schematic plan view showing a principal construction of a semiconductor memory according to the first embodiment of the present invention.
Figure 3:
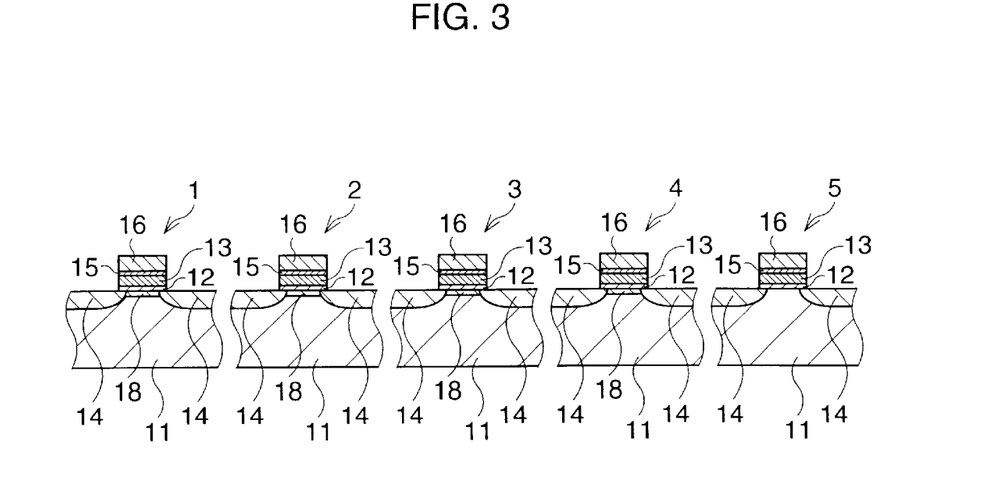
FIG. 3 is a schematic sectional view showing a principal construction of the semiconductor memory according to the first embodiment of the present invention.

FIG. 2 is a schematic plan view showing a principal construction of the semiconductor memory according to the first embodiment, and FIG. 3 is a schematic sectional view thereof.

The device comprises memory cells 1 (only one of them is shown) and reference cells 2 to 5 which are used as criteria for judging the threshold values set in accordance with various states of the memory cells 1. The reference cells 2 to 5 are used for read verification, for write verification, for erasion verification, and for over-erasion detection, respectively.

The memory cells 1 and the reference cells 2 to 5 are formed into substantially the same construction. More specifically, each cell comprises a tunnel insulating film 12 of, e.g., silicon dioxide, formed on a semiconductor substrate 11; a floating gate 13 of, e.g., polysilicon, formed on the tunnel insulating film 12 into an island shape so as to separate from the floating gates 13 of the adjacent cells; and a pair of source and drain regions 14 formed in the semiconductor substrate 11 on both sides of the floating gate 13 by ion implantation of impurities. In each cell, the portion of the semiconductor substrate 11 between the source and drain regions 14 functions as a channel region. Linear control gates 16 are formed such that each of them extends over the floating gates 13 of a number of cells. An insulating film 15 is interposed between each pair of control gate 16 and floating gate 13. Bit lines 17 are formed such that each of them is electrically connected to one of the source and drain regions 14 (usually to the drain region) of each of the corresponding cells.

Each control gate 16 is substantially perpendicular to each bit line 17, and the cells 1 to 5 are disposed into a matrix. Each cell can be accessed by selecting the corresponding one of the control gates 16 and the corresponding one of the bit lines 17.

Figure 4:
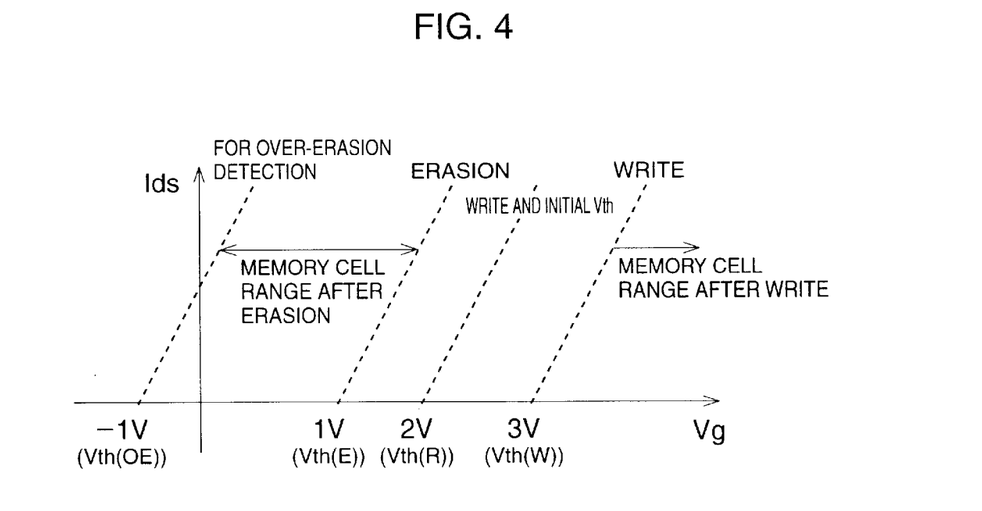
FIG. 4 is a chart showing examples of set threshold values of reference cells.

FIG. 4 shows examples of set threshold values of the reference cells 2 to 5. In FIG. 4, Vth(OE), Vth(E), Vth(R), and Vth(W) represent the set threshold value (=−1V) of the over-erasion detection cell 5, the set threshold value (=1V) of the erasion verification cell 4, the set threshold value (=2V) of the read verification cell 2, and the set threshold value (=3V) of the write verification cell 3, respectively. The initial threshold value Vth(I) of the memory cells 1 is the same (2V) as Vth(R). By thus setting the threshold values of the reference cells 2 to 5, the threshold value of each memory cell 1 is between Vth(OE) and Vth(E) after erasing its stored data, and takes a predetermined value more than Vth(W) after writing.

In this embodiment, at least one of the reference cells 2 to 5 is formed with its initial threshold value being different from that of the memory cells 1, in view of not only making the respective initial threshold values of the reference cells 2 to 5 approach the threshold values to be set, but also forming the reference cells 2 to 5 and the memory cells 1 as efficiently and conformably as possible in a small number of steps. More specifically, in the reference cells 2 to 5, the set threshold value of the over-erasion detection cell 5 is the most distant from the initial threshold value Vth(I) of the memory cells 1, as shown in FIG. 4. It is therefore thinkable that deterioration of data retention characteristic (in this case, charge gain) is the most apt to occur on the over-erasion detection cell 5. For this reason, in a manufacturing process of the semiconductor memory, the initial threshold value of the over-erasion detection cell 5 is controlled as described below.

A manufacturing process of the semiconductor memory that takes into account the above control of the initial threshold value, will be described below.

Figure 5A:
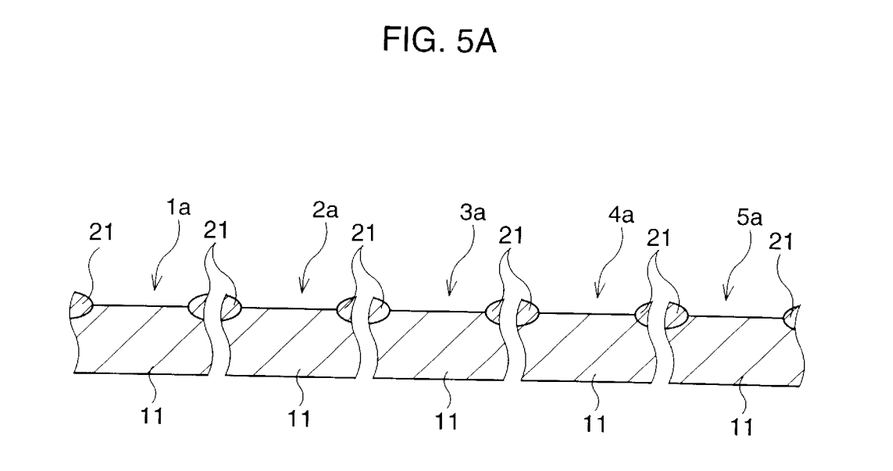
FIGS. 5A and 5B are schematic sectional views showing, in order, steps of a manufacturing process of the semiconductor memory according to the first embodiment of the present invention.
Figure 5B:
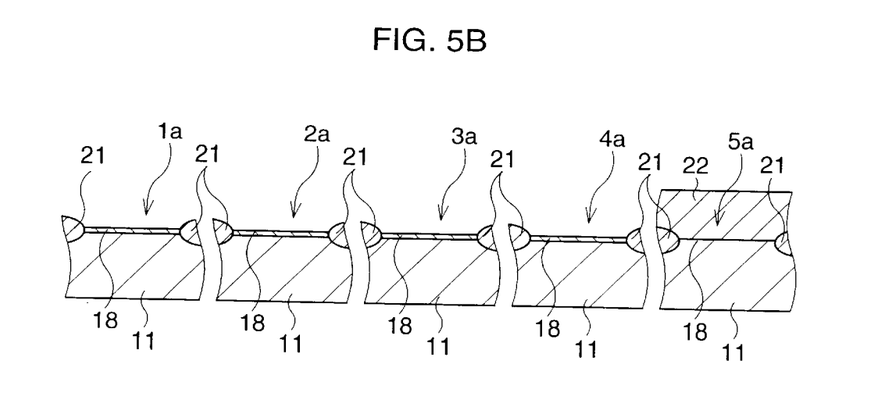
Figure 6:
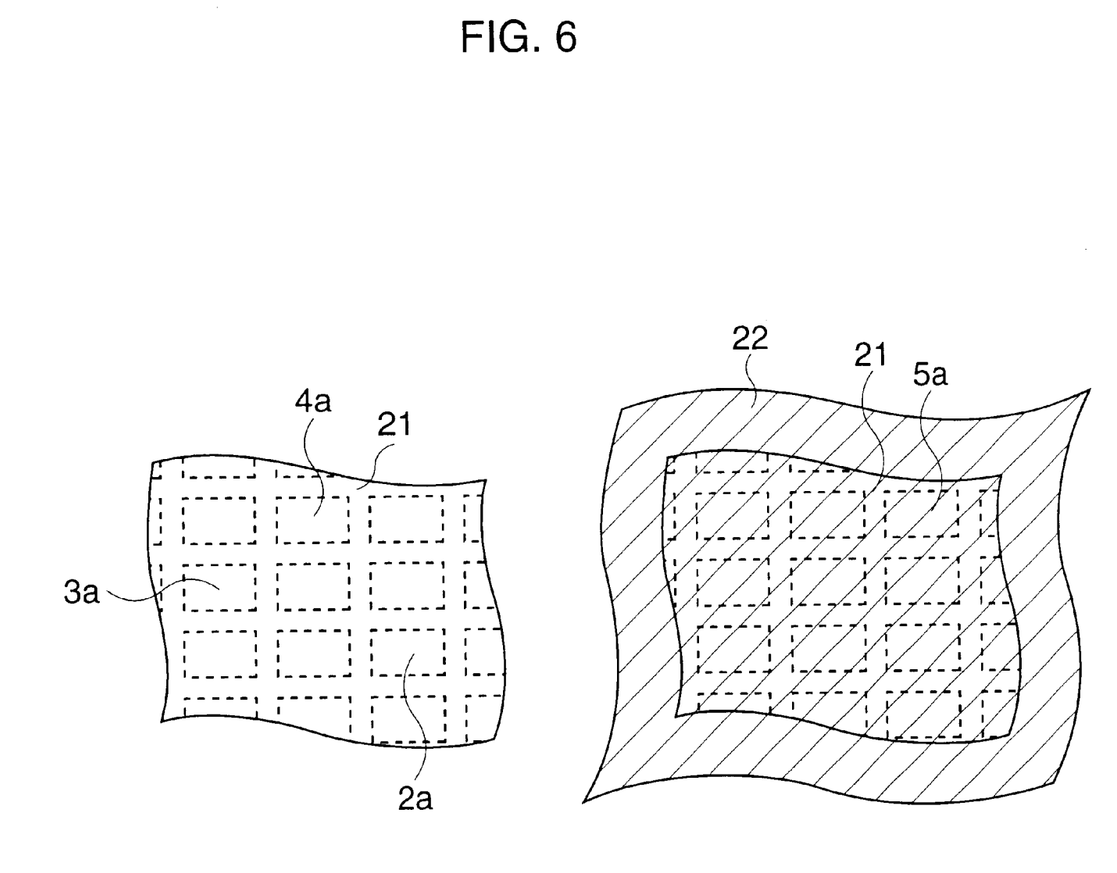
FIG. 6 is a schematic plan view showing a regulation step for initial threshold value in the first embodiment.

FIGS. 5A and 5B are schematic sectional views showing, in order, steps of a manufacturing process of the semiconductor memory according to this embodiment, and FIG. 6 is a schematic plan view showing a regulation step for initial threshold value.

First, as shown in FIG. 5A, a field oxidation film 21 is formed as an element isolation structure at the element isolation region on the surface of a p-type silicon semiconductor substrate 11 by, e.g., LOCOS method, to define the element activation regions 1a to 5a of the respective cells 1 to 5. Note that the element isolation structure is not limited to such a field oxidation film. For example, a trench-type element isolation structure may be used, in which a trench is formed at the element isolation region of the semiconductor substrate and then filled with an insulating film for element isolation.

Next, as shown in FIGS. 5B and 6, a photoresist is applied to the whole surface and processed by photolithography to form a resist mask 22 covering only the element activation region 5a where the over-erasion detection cell 5 is to be formed. In this state, p-type impurities such as boron (B) are ion-implanted under conditions of acceleration energy of, e.g., 40 to 60 KeV, and doze of, e.g., $1\times10^{13}$ to $1\times10^{14}\,cm^{-2}$, to form Vth control layers 18 in the portions which are to be the channel regions of the cells 1 to 4 other than the over-erasion detection cell 5.

The resist mask 22 is then removed by, e.g., ashing process. The subsequent steps of process are in common to all the cells 1 to 5. More specifically, a tunnel insulating film 12 for each cell is formed by, e.g., thermal oxidation. A film of, e.g., polysilicon, is deposited by CVD method and then separated into island shapes for the respective cells by patterning to form floating gates 13. After this, source and drain regions 14 are formed using the floating gates 13 as masks. Insulating films 15 and control gates 16 are then formed. An insulating interlayer (not shown) is then formed to cover the whole surface, and contact holes 19 are formed therein. Bit lines 17 are then formed to fill in the contact holes 19 and extend on the interlayer. The principal construction of the semiconductor memory as shown in FIG. 3 is completed through the above steps of process.

In the manner of this embodiment, the over-erasion detection cell 5 having the greatest difference between its set threshold value and the initial threshold value of the memory cells 1, includes no Vth control layer 18, differently from the other reference cells 2 to 4. The initial threshold value of the over-erasion detection cell 5 is thereby made to approach the threshold value to be set. This suppresses deterioration of the data retention characteristic of the over-erasion detection cell 5, and makes it possible to realize a reliable semiconductor memory without unnecessarily increasing steps of manufacturing process.

The over-erasion detection cell 5 has some fear of short channel effect since it includes no Vth control layer 18. But, it can be avoided by taking a measure of, e.g., increasing the corresponding gate length of the control gate 16.

Modification

Some modifications of this embodiment will be described below. In the modifications, the same parts or the like as those of the semiconductor memory of the embodiment are denoted by the same references as those of the embodiment, respectively, and their explanations will be omitted.

Modification 1

In this modification, impurities of the conductivity type (in this case, n-type) different from that of the semiconductor substrate 11 when the initial threshold value of the over-erasion detection cell 5 is controlled following the steps shown in FIGS. 5B and 6.

Figure 7A:
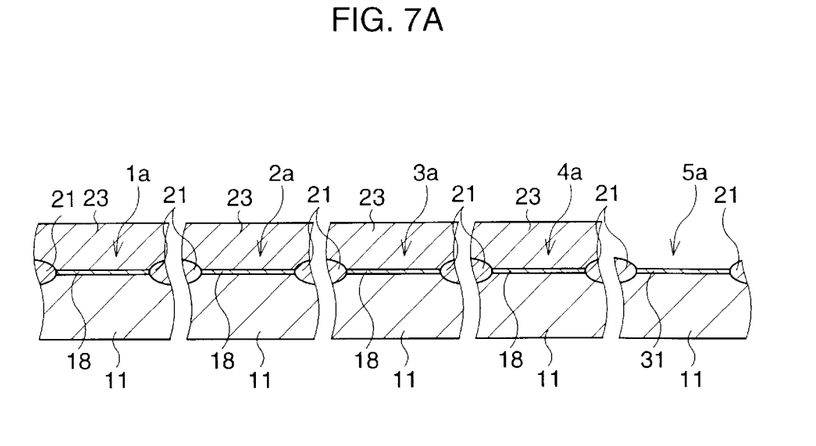
FIGS. 7A and 7B are schematic sectional views showing, in order, principal steps of a manufacturing process of a semiconductor memory according to the first modification of the first embodiment.
Figure 7B:
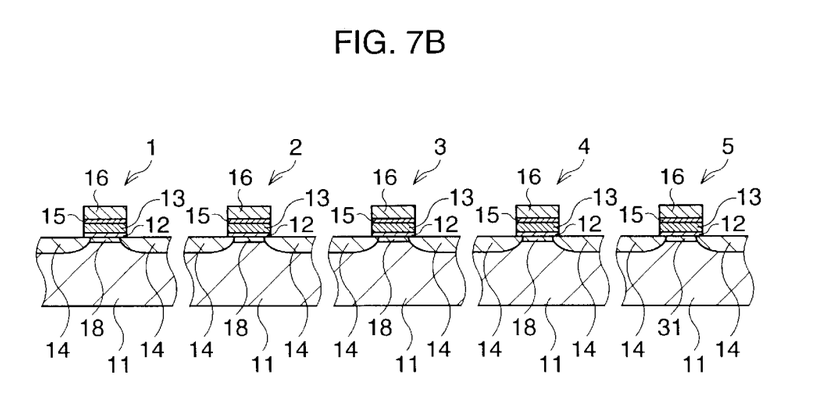

FIGS. 7A and 7B are schematic sectional views showing, in order, principal steps of a manufacturing process of a semiconductor memory according to this modification 1.

In this modification, after p-type impurities are ion-implanted into the element activation regions 1a to 4a other than the element activation region 5a to form Vth control layers 18, the resist mask 22 is removed by ashing, and then another resist mask 23 is formed to cover the element activation regions 1a to 4a, as shown in FIG. 7A. Impurities of n-type such as phosphorus (P) are then ion-implanted into the element activation region 5a under conditions of acceleration energy of, e.g., 20 KeV, and doze of, e.g., $1 \times 10^{12}$ to $1 \times 10^{13}$ cm$^{-2}$, to form a Vth control layer 31 in the portion which is to be the channel region of the over-erasion detection cell 5.

After this, the resist mask 23 is removed by ashing, and a semiconductor memory including the over-erasion detection cell 5, which operates as a so-called depletion-layer transistor, is completed through the same process as that of the embodiment, as shown in FIG. 7B.

In this case, in order to avoid an increase in steps of manufacturing process due to the ion implantation step of n-type impurities, the implantation step is preferably performed simultaneously with the ion implantation step to form Vth control layers in various p-type transistors in a peripheral circuit portion of the memory cells 1.

In the manner of this modification 1, the over-erasion detection cell 5 having the greatest difference between its set threshold value and the initial threshold value of the memory cells 1, includes an n-type Vth control layer 31, differently from the memory cells 1 and the other reference cells 2 to 4. The initial threshold value of the over-erasion detection cell 5 is thereby made to approach more its set threshold value. This suppresses deterioration of the data retention characteristic of the over-erasion detection cell 5. That is, even if charge gain to the initial threshold value occurs, accurate detection of over-erasion can be performed because a current flows even when the corresponding control gate 16 is at 0 V (see FIG. 4). This makes it possible to realize a reliable semiconductor memory without unnecessarily increasing steps of manufacturing process.

Modification 2

In this modification, the initial threshold value of the write verification cell 3, which has the most fear of occurrence of charge loss, is controlled in place of controlling the initial threshold value of the over-erasion detection cell 5, in the steps shown in FIGS. 5B and 6.

Figure 8A:
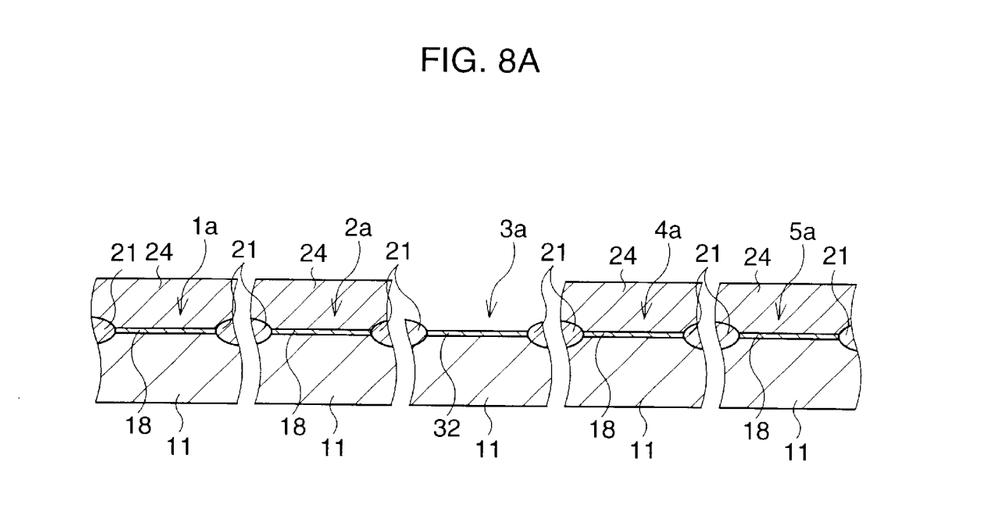
FIGS. 8A and 8B are schematic sectional views showing, in order, principal steps of a manufacturing process of a semiconductor memory according to the second modification of the first embodiment.
Figure 8B:
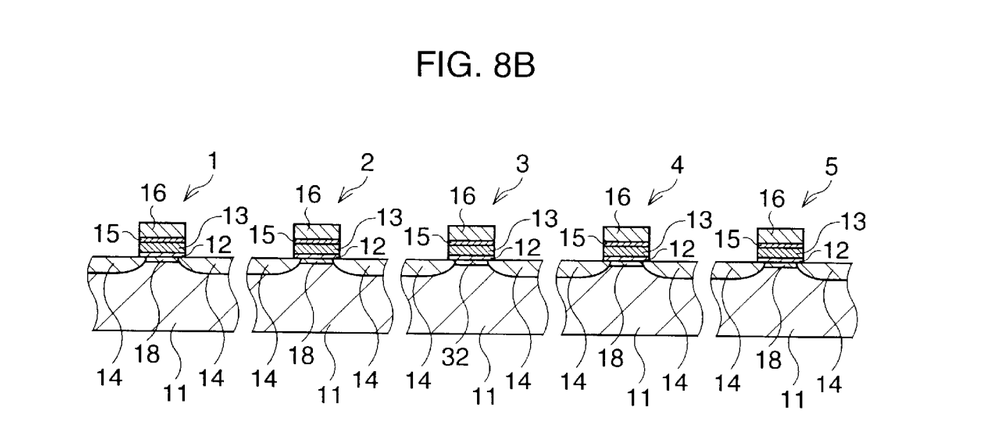

FIGS. 8A and 8B are schematic sectional views showing, in order, principal steps of a manufacturing process of a semiconductor memory according to this modification 2.

In this modification, after the step of FIG. 5A, p-type impurities such as boron (B) are ion-implanted over the whole surface under conditions of acceleration energy of, e.g., 40 to 60 KeV, and doze of, e.g., $1 \times 10^{13}$ to $1 \times 10^{14}$ cm$^{-2}$, to form Vth control layers 18 in the element activation regions 1a to 5a, as shown in FIG. 8A.

A resist mask 24 is then formed to cover the element activation regions 1a, 2a, 4a, and 5a. Impurities of p-type are again ion-implanted into the element activation region 3a under conditions of acceleration energy of, e.g., 40 to 60 KeV, and doze of, e.g., $1 \times 10^{13}$ to $1 \times 10^{14}$ cm$^{-2}$. A Vth control layer 32 is thereby formed in the portion which is to be the channel region of the write verification cell 3, to superimpose the Vth control layer 18 in that portion. The Vth control layer 32 thereby has its concentration of p-type impurities higher than the Vth control layer 18.

After this, a semiconductor memory is completed through the same process as that of the embodiment, as shown in FIG. 8B.

In the manner of this modification 2, the write verification cell 3, which has a great difference between its set threshold value and the initial threshold value of the memory cells 1, and is apt to bring about charge loss, includes a Vth control layer 32 having its concentration of p-type impurities higher than the Vth control layers 18 of the memory cells 1 and the other reference cells 2, 4, and 5. The initial threshold value of the write verification cell 3 is thereby made to approach the threshold value to be set. This suppresses deterioration of the data retention characteristic of the write verification cell 3, and makes it possible to realize a reliable semiconductor memory without unnecessarily increasing steps of manufacturing process.

Modification 3

In this modification, the initial threshold values of the reference cells 3 to 5 are adjusted to the respective desired values. For this purpose, various manners are thinkable in accordance with the reference cells 3 to 5. An example among them will be described below.

FIGS. 9A to 9D are schematic sectional views showing, in order, principal steps of a manufacturing process of a semiconductor memory according to this modification 3.

Figure 9A:
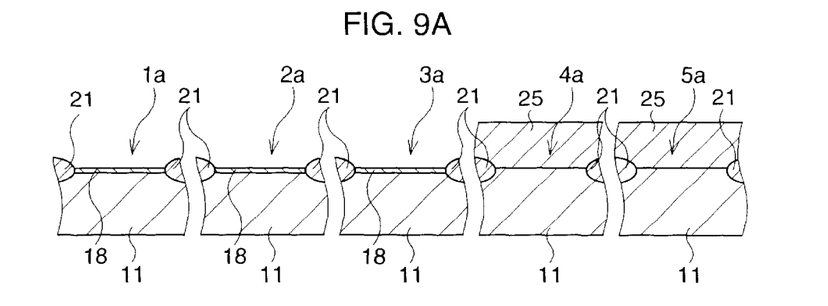
FIGS. 9A to 9D are schematic sectional views showing, in order, principal steps of a manufacturing process of a semiconductor memory according to the third modification of the first embodiment.

In this modification, after the step of FIG. 5A, a resist mask 25 is formed to cover only the element activation regions 4a and 5a where the erasion verification cell 4 and the over-erasion detection cell 5 are to be formed, as shown in FIG. 9A. In this state, p-type impurities such as boron (B) are ion-implanted under conditions of acceleration energy of, e.g., 40 to 60 KeV, and doze of, e.g., $1 \times 10^{13}$ to $1 \times 10^{14}$ cm$^{-2}$, to form Vth control layers 18 in the portions which are to be the channel regions of the cells 1 to 3 other than the cells 4 and 5. In this case, because the set threshold value of the read verification cell 2 is almost equal to the initial threshold value of the memory cells 1, the element activation region 2a is used intact for forming the read verification cell 2.

At this time, no Vth control layer 18 is formed in either of the element activation regions 4a and 5a. Besides, the set threshold value of the erasion verification cell 4 is closer to the initial threshold value of the memory cells 1 than that of the over-erasion detection cell 5. In consideration of these conditions, the element activation region 4a is used intact for forming the erasion verification cell 4. The initial threshold value of the erasion verification cell 4 is thereby made to approach the threshold value to be set.

Figure 9B:
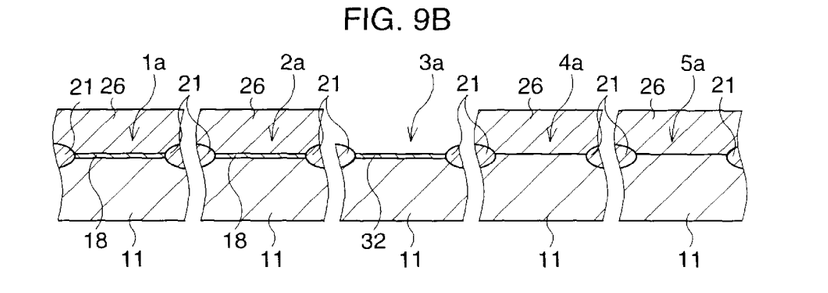

After the step of FIG. 9A, the resist mask 25 is removed by, e.g., ashing process. Another resist mask 26 is then formed to cover the element activation regions 1a, 2a, 4a, and 5a, as shown in FIG. 9B. Impurities of p-type are again ion-implanted into the element activation region 3a under conditions of acceleration energy of, e.g., 40 to 60 KeV, and doze of, e.g., $1 \times 10^{13}$ to $1 \times 10^{14}$ cm$^{-2}$. A Vth control layer 32 is thereby formed in the portion which is to be the channel region of the write verification cell 3, to superimpose the Vth control layer 18 in that portion. The Vth control layer 32 thereby has its concentration of p-type impurities higher than the Vth control layer 18, and the initial threshold value of the write verification cell 3 is made to approach the threshold value to be set.

Figure 9C:
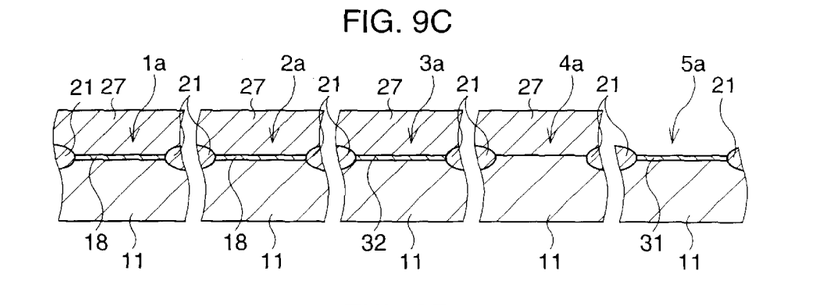

The resist mask 26 is then removed by, e.g., ashing process, and another resist mask 27 is formed to cover the element activation regions 1a to 4a, as shown in FIG. 9C. Impurities of n-type such as phosphorus (P) are then ion-implanted into the element activation region 5a under conditions of acceleration energy of, e.g., 20 KeV, and doze of, e.g., $1 \times 10^{12}$ to $1 \times 10^{13}$ cm$^{-2}$, to form a Vth control layer 31 in the portion which is to be the channel region of the over-erasion detection cell 5. The initial threshold value of the over-erasion detection cell 5 is thereby made to approach the threshold value to be set.

Figure 9D:
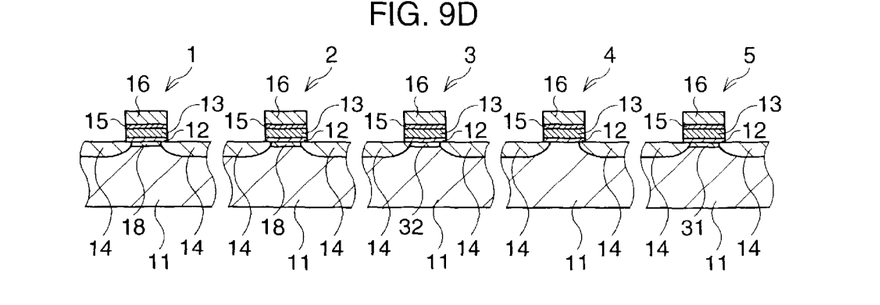

After this, the resist mask 27 is removed by, e.g., ashing process, and a semiconductor memory is completed through the same process as that of the embodiment, as shown in FIG. 9D.

In the manner of this modification 3, the initial threshold values of the reference cells 2 to 5 are made to approach the threshold values to be set, respectively. This causes some increase in steps of manufacturing process, but makes it possible to control minutely the initial threshold values of the respective reference cells 2 to 5, and to realize a very reliable semiconductor memory.

Modification 4

This modification exemplifies a semiconductor memory in which each memory cell is constructed as a so-called multivalued memory cell, and different cells for verifying in reading are provided to have different set threshold values according to the multivalued states of the memory cells.

In a conventional semiconductor memory in practical use, each memory cell has only two storage states of "0" and "1", i.e., the storage capacity of each memory cell is one bit (binary). Contrastingly, in a multivalued memory, each memory cell has three or more storage states. For example, in case of two bits (four values), each memory cell has four storage states of "00", "01", "10", and "11" corresponding to four threshold values. Of course, the storage capacity of each memory cell is not limited to two bits. It may be three or more bits ($2^n$ values: $n \geq 3$). Further, it may be $3^m$ values ($m \geq 1$) in combination of 0, 1, and 2, or the like.

In such a case, a read verification cell must be provided for the threshold value corresponding to each storage state. For this purpose, ion implantation processes should be separately performed using resist masks to the respective element activation regions where such read verification cells are to be formed, like the modification 3. The initial threshold values of the read verification cells are thereby adjusted to the aimed values to approach the threshold values being set, respectively.

In the manner of this modification 4, as for each of the read verification cells provided to correspond to the respective threshold values of each multivalued memory cell, its initial threshold value is made to approach its threshold value to be set. This makes it possible to control minutely the respective initial threshold values, and to realize a very reliable multivalued semiconductor memory.

Second Embodiment

The second embodiment of the present invention will be described next. This second embodiment exemplifies a semiconductor memory including memory cells used to read only. In this second embodiment, the same parts or the like as those of the first embodiment are denoted by the same references as those of the first embodiment, respectively, and their explanations will be omitted.

Figure 10:
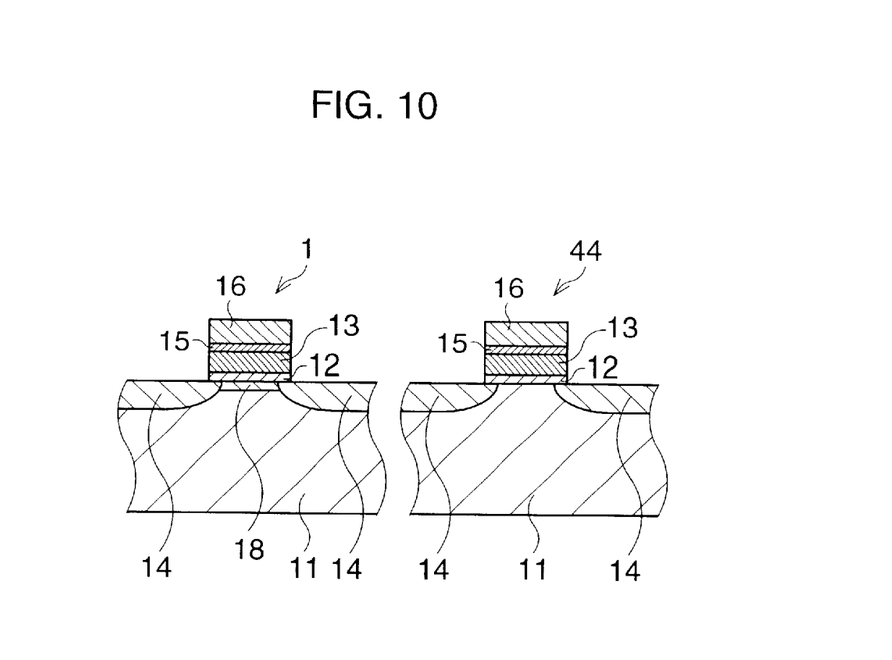
FIG. 10 is a schematic sectional view showing a principal construction of a semiconductor memory according to the second embodiment of the present invention.
Figure 11:
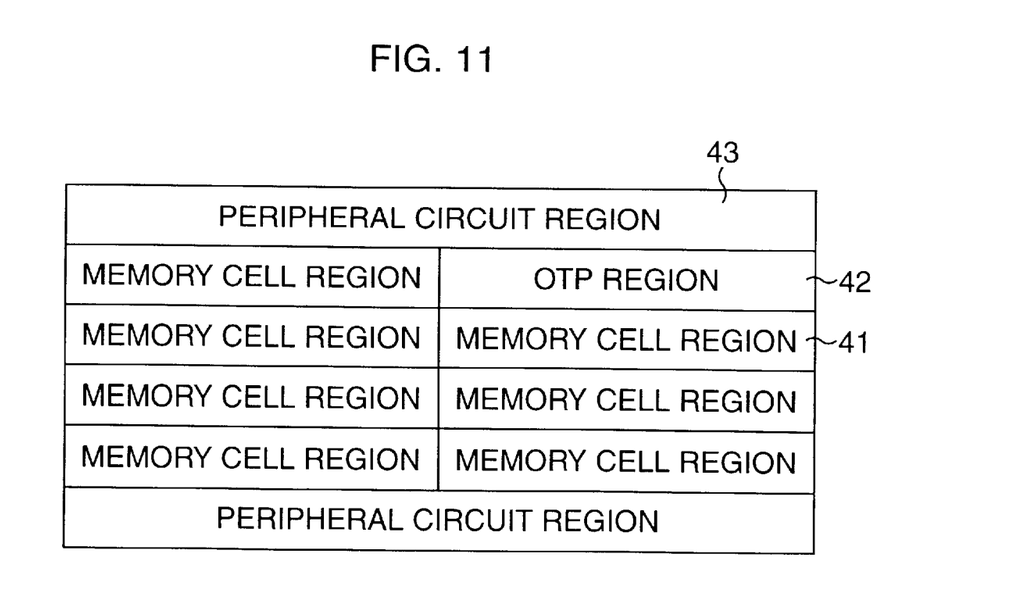
FIG. 11 is a representation schematically showing a plane arrangement in the semiconductor memory according to the second embodiment of the present invention.

FIG. 10 is a schematic sectional view showing a principal construction of the semiconductor memory according to the second embodiment, and FIG. 11 is a representation schematically showing a plane arrangement in the device.

The device comprises memory cell regions 41 where memory cells 1 are disposed in a matrix, an OTP region 42 where OTP region cells programmable only once and inhibited from being erased after then, are disposed like the memory cells 1, and peripheral circuit portions 43. Note that a device including redundancy transistors for storing data to be displaced from a defective bit to a non-defective bit, in place of the OTP region cells 44, has the same construction.

Like the reference cells in the first embodiment, each OTP region cell 44 is formed into substantially the same construction in substantially the same process as the memory cells 1 in order to avoid an increase in steps of manufacturing process and to simplify the process. The OTP region cells 44 differ from the memory cells 1 in the point that their initial threshold value is regulated to be smaller than that of the memory cells 1, and controlled to have a little difference from the threshold value after erasing of the OTP region cells 44. This purpose is attained only by controlling the initial threshold value of the OTP region cells 44 into a small value to approach the threshold value after erasing, because the threshold value after erasing of such OTP region cells 44 is generally regulated into a value smaller than the initial threshold value.

The memory cells 1 can not have a too small initial threshold value because of necessity of ensuring good write performance and suppressing short channel effect. Contrastingly, the OTP region cells 44 can have a relatively small initial threshold value because they are subjected to write operation only once and do not require so high write performance.

Figure 12:
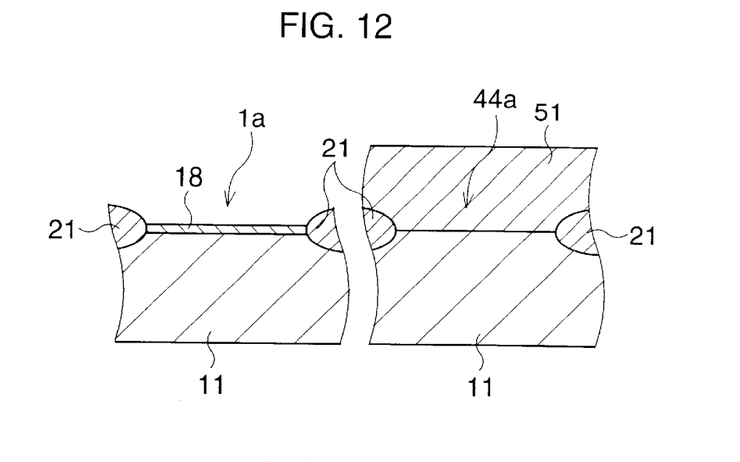
FIG. 12 is a schematic sectional view showing a regulation step for initial threshold value in the second embodiment.

In a manufacturing process according to this embodiment, each element activation region 1a (in a memory cell region 41) where a memory cell 1 is to be formed, and each element activation region 44a (in the OTP region 42) where an OTP region cell 44 is to be formed, are defined in the same step of FIG. 5A of the first embodiment. A resist mask 51 is then formed to cover the element activation regions 44a, as shown in FIG. 12. In this state, p-type impurities such as boron (B) are ion-implanted under conditions of acceleration energy of, e.g., 40 to 60 KeV, and doze of, e.g., $1 \times 10^{13}$ to $1 \times 10^{14}$ cm$^{-2}$, to form Vth control layers 18 in the portions which are to be the channel regions of the memory cells 1, other than the element activation regions 44a.

The resist mask 51 is then removed by, e.g., ashing process. The subsequent steps of process are in common to the memory cells 1 and the OTP region cells 44. That is, the semiconductor memory shown in FIG. 11 is completed through the same steps of process as those of the first embodiment.

In the manner of this embodiment, each OTP region cell 44 having its set threshold value smaller than the initial threshold value of the memory cells 1, includes no Vth control layer 18, differently from the memory cells 1. The initial threshold value of the OTP region cell 44 is thereby made to approach the threshold value to be set. This suppresses deterioration of the charge gain characteristic of the OTP region cell 44, and makes it possible to realize a reliable semiconductor memory without unnecessarily increasing steps of manufacturing process.

Each OTP region cell 44 has some fear of short channel effect since it includes no Vth control layer 18. But, it can be avoided by taking a measure of, e.g., increasing the corresponding gate length of the control gate 16.

Modification

A modification of this embodiment will be described below. In the modification, the same parts or the like as those of the semiconductor memory of the embodiment are denoted by the same references as those of the embodiment, respectively, and their explanations will be omitted.

In this modification, impurities of the conductivity type (in this case, n-type) different from that of the semiconductor substrate 11 when the initial threshold value of the OTP region cells 44 is controlled.

Figure 13A:
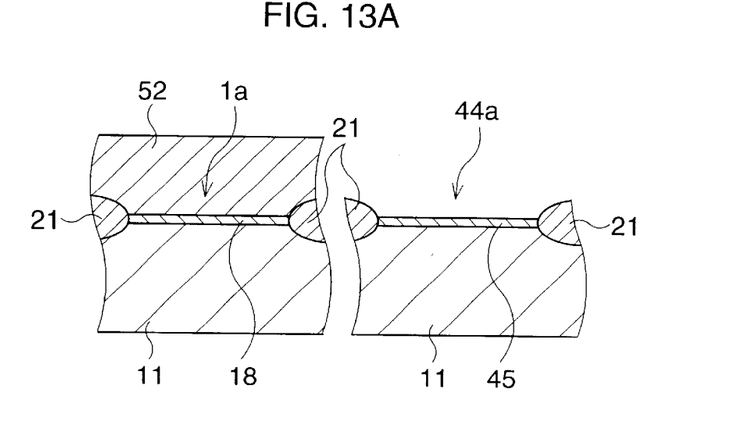
FIGS. 13A and 13B are schematic sectional views showing, in order, principal steps of a manufacturing process of a semiconductor memory according to a modification of the second embodiment.
Figure 13B:
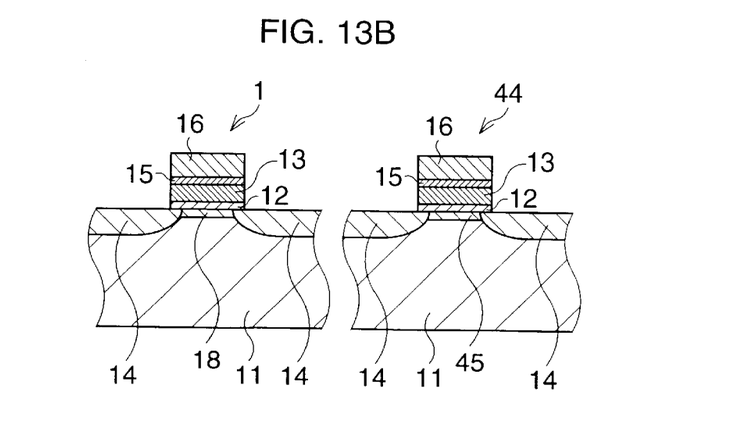

FIGS. 13A and 13B are schematic sectional views showing, in order, principal steps of a manufacturing process of a semiconductor memory according to this modification.

In this modification, after the Vth control layers 18 are formed in the portions which are to be the channel regions of the memory cells 1, as shown in FIG. 12, and the resist mask 51 is removed, another resist mask 52 is formed to cover each element activation region 1a. Impurities of n-type such as phosphorus (P) are then ion-implanted into each element active region 44a under conditions of acceleration energy of, e.g., 20 KeV, and doze of, e.g., $1\times10^{12}$ to $9\times10^{12}$ cm$^{-2}$, to form Vth control layers 45 having its impurity concentration lower than the Vth control layers 18, in the portions which are to be the channel regions of the OTP region cells 44.

After this, a semiconductor memory including the memory cells 1 and the OTP region cells 44 is completed through the same steps of process as those of the embodiment, as shown in FIG. 13B.

In the manner of this modification, the initial threshold value of the OTP region cells 44 is made to approach the threshold value to be set, independently of the memory cells 1. This causes some increase in steps of manufacturing process, but makes it possible to control minutely the initial threshold values of the memory cells 1 and the OTP region cells 44, and to realize a very reliable semiconductor memory.

What is claimed is:

1. A manufacturing method of a semiconductor memory comprising a first cell which is a memory cell including a first charge storage layer, and a second cell which is a reference cell used as criteria for judging the threshold values set in accordance with various states of the first cell, including a second charge storage layer and used with a reference threshold value fixed to a certain value, said method comprising:

a) introducing impurities into a channel region of said first cell to set a first threshold value; and b) introducing impurities into a channel region of said second cell to set said second threshold value which is different from the first threshold value such that the second threshold value is closer to the reference threshold value than the first threshold value.

2. A method according to claim 1, wherein said first and second cells are formed in the same process except said steps a) and b) are performed separately.

3. The method according to claim 1, wherein the second threshold value approach the reference threshold value as closely as possible in the step b).

* * * * *